United States Patent
Xie et al.

(10) Patent No.: US 10,804,344 B2
(45) Date of Patent: Oct. 13, 2020

(54) DISPLAY SUBSTRATE AND METHOD FOR FABRICATING THE SAME, AND DISPLAY APPARATUS

(71) Applicant: BOE TECHNOLOGY GROUP CO., LTD., Beijing (CN)

(72) Inventors: Dini Xie, Beijing (CN); Wei Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/121,063

(22) Filed: Sep. 4, 2018

(65) Prior Publication Data
US 2019/0074337 A1   Mar. 7, 2019

(30) Foreign Application Priority Data
Sep. 7, 2017   (CN) .......................... 2017 1 0801464

(51) Int. Cl.
| | | |
|---|---|---|
| *H01L 27/32* | (2006.01) | |
| *H01L 51/50* | (2006.01) | |
| *H01L 51/56* | (2006.01) | |
| *H01L 27/12* | (2006.01) | |
| *H01L 51/00* | (2006.01) | |

(52) U.S. Cl.
CPC ...... *H01L 27/3246* (2013.01); *H01L 27/3258* (2013.01); *H01L 51/5012* (2013.01); *H01L 51/5088* (2013.01); *H01L 51/56* (2013.01); *H01L 27/1248* (2013.01);
(Continued)

(58) Field of Classification Search
CPC . H01L 27/3246; H01L 51/56; H01L 51/0005; H01L 51/5088; H01L 27/1248; H01L 51/5012
See application file for complete search history.

(56) References Cited

U.S. PATENT DOCUMENTS

| | | |
|---|---|---|
| 2010/0181554 A1 | 7/2010 | Yoshida et al. |
| 2012/0228596 A1* | 9/2012 | Fujita ................. H01L 27/3276 257/40 |

(Continued)

FOREIGN PATENT DOCUMENTS

| | | |
|---|---|---|
| CN | 101681997 A | 3/2010 |
| JP | 2005-331665 A | 12/2005 |

OTHER PUBLICATIONS

Office Action dated Jun. 18, 2019 issued in corresponding Chinese Application No. 201710801464.6.

*Primary Examiner* — Dung A. Le
(74) *Attorney, Agent, or Firm* — Nath, Goldberg & Meyer; Joshua B. Goldberg

(57) ABSTRACT

The present disclosure provides a display substrate and a method for fabricating the same, and a display apparatus. The display substrate includes a pixel defining layer, a recessed structure having a recessed surface and a light-emitting functional layer. The pixel defining layer and the light-emitting functional layer are on a side of the recessed structure where the recessed surface is provided. The pixel defining layer defines a pixel region. The recessed surface of the recessed structure is in the pixel region. The light-emitting functional layer is in the pixel region, and a surface of the light-emitting functional layer proximal to the recessed structure is at least partially conformal to the recessed surface.

18 Claims, 4 Drawing Sheets

(52) U.S. Cl.
CPC ...... *H01L 27/3248* (2013.01); *H01L 51/0005* (2013.01); *H01L 2227/323* (2013.01); *H01L 2251/558* (2013.01)

(56) References Cited

U.S. PATENT DOCUMENTS

| | | | |
|---|---|---|---|
| 2013/0001603 A1* | 1/2013 | Lim | H01L 51/5209 257/88 |
| 2014/0312312 A1* | 10/2014 | Takii | H01L 27/3262 257/40 |
| 2015/0137101 A1* | 5/2015 | Choi | H01L 51/5209 257/40 |
| 2015/0206928 A1 | 7/2015 | Kimura et al. | |
| 2017/0005286 A1* | 1/2017 | Yun | H01L 51/5209 |
| 2017/0125719 A1* | 5/2017 | Noh | H01L 27/3211 |
| 2018/0166648 A1* | 6/2018 | Dai | H01L 51/56 |
| 2018/0197929 A1* | 7/2018 | Cho | H01L 27/3258 |

* cited by examiner

DISPLAY SUBSTRATE AND METHOD FOR FABRICATING THE SAME, AND DISPLAY APPARATUS

CROSS-REFERENCE TO RELATED APPLICATION

This application claims the benefit of priority to Chinese Patent Application No. 201710801464.6 filed on Sep. 7, 2017, the contents of which are incorporated herein in their entirety by reference.

TECHNICAL FIELD

The present disclosure relates to the field of display technology, and particularly relates to a display substrate and a method for fabricating the same, and a display apparatus.

BACKGROUND

A pixel defining layer (PDL, for short) for defining a pixel region is provided in an organic light-emitting diode (OLED, for short) display panel, and a light-emitting functional layer is provided in the pixel region. During formation of the PDL, an acrylic/PI material in the material of the PDL is deposited downward to form a lower structure of the PDL, and a fluorine-containing resin material in the material of the PDL is floated to the surface to form an upper structure of the PDL. The material of the lower structure of the PDL is hydrophilic, while the material of the upper structure of the PDL is hydrophobic.

SUMMARY

The present disclosure provides a display substrate and a method for fabricating the same, and a display apparatus.

In an aspect, the present disclosure provides a display substrate, including a pixel defining layer, a recessed structure having a recessed surface and a light-emitting functional layer, wherein the pixel defining layer and the light-emitting functional layer are on a side of the recessed structure where the recessed surface is provided; the pixel defining layer defines a pixel region; the recessed surface of the recessed structure is in the pixel region; the light-emitting functional layer is in the pixel region, and a surface of the light-emitting functional layer proximal to the recessed structure is at least partially conformal to the recessed surface.

Optionally, the display substrate further includes an insulation layer, and a part of the insulation layer in the pixel region serves as the recessed structure.

Optionally, the recessed structure has a smaller thickness at an intermediate position than at an edge position.

Optionally, the recessed surface of the recessed structure is an arc-shaped surface.

Optionally, the display substrate further includes a first electrode, the first electrode is on a side of the pixel defining layer and the light-emitting functional layer proximal to the insulation layer and on a side of the insulation layer proximal to the pixel defining layer and the light-emitting functional layer.

Optionally, a surface of a part of the first electrode that directly faces the recessed surface of the recessed structure is conformal to the recessed surface.

Optionally, the light-emitting functional layer includes a plurality of light-emitting functional sub-layers, and a surface, proximal to the recessed structure, of at least one light-emitting functional sub-layer proximal to the recessed structure is at least partially conformal to the recessed surface.

Optionally, the plurality of light-emitting functional sub-layers include a hole inject layer, a hole transport layer, an electroluminescence layer, an electron transport layer, and an electron inject layer, which are sequentially disposed in a direction away from the recessed structure, and a surface of the hole inject layer proximal to the recessed structure is at least partially conformal to the recessed surface.

Optionally, the surface of the hole inject layer proximal to the recessed structure is arc-shaped, and a surface of the hole inject layer distal to the recessed structure is also arc-shaped.

Optionally, a difference in thickness throughout at least one of the plurality of light-emitting functional sub-layers is in the range of 0 nm to 100 nm.

Optionally, at least one of the plurality of light-emitting functional sub-layers has a uniform thickness.

Optionally, the recessed structure is made of a resin material.

Optionally, the recessed structure is made of an organic photosensitive resin material.

Optionally, the organic photosensitive resin material is an acrylic material or a polyimide material mixed with a photosensitive monomer.

Optionally, the display substrate further includes a base substrate, and a part of the base substrate in the pixel region serves as the recessed structure.

In another aspect, the present disclosure provides a display apparatus, including the above display substrate according to the present disclosure.

In another aspect, the present disclosure provides a method for fabricating a display substrate, including:

forming a recessed structure having a recessed surface;

forming a pixel defining layer on a side of the recessed structure where the recessed surface is provided, the pixel defining layer defining a pixel region, and the recessed surface of the recessed structure being within the pixel region; and forming a light-emitting functional layer on the side of the recessed structure where the recessed surface is provided, the light-emitting functional layer being within the pixel region, and a surface of the light-emitting functional layer proximal to the recessed structure being at least partially conformal to the recessed surface.

Optionally, forming the recessed structure includes:

forming an insulation layer; and forming a part of the insulation layer in the pixel region into the recessed structure.

Optionally, forming a part of the insulation layer in the pixel region into the recessed structure includes:

exposing the insulation layer using a mask to form an unexposed area, a fully exposed area, and a partially exposed area, the partially exposed area including an exposed portion and an unexposed portion; and developing the exposed insulation layer to remove the fully exposed area to form a via hole, remove the exposed portion in the partially exposed area to form the recessed structure, and keep the unexposed area and the unexposed portion in the partially exposed area.

Optionally, the light-emitting functional layer is formed in the pixel region by an ink jet print process.

DETAILED DESCRIPTION

To make those skilled in the art better understand technical solutions of the present disclosure, a display substrate and a method for fabricating the same, and a display apparatus provided in the present disclosure will be further described in detail below in conjunction with the accompanying drawings.

Figure 6:
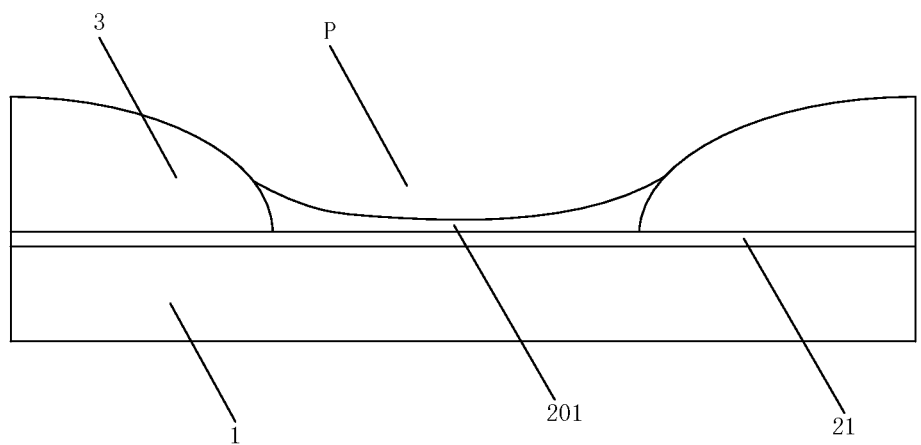
FIG. 6 is a schematic structure diagram of a conventional display substrate.

Generally, a light-emitting functional layer may include a hole inject layer, a hole transport layer, an electroluminescence layer, an electron transport layer, and an electron inject layer, which are sequentially disposed. By taking the hole inject layer as an example, since the material of the hole inject layer is hydrophilic, infiltration phenomenon may occur between the hole inject layer and the side of the lower structure of the PDL in the deposition process of the hole inject layer; under the action of the infiltration, the hole inject layer will climb up along the side of the lower structure of the PDL until it reaches the interface between the lower structure and the upper structure of the PDL. This may cause the shape of the hole inject layer to be bent, resulting in non-uniform thickness of the hole inject layer. As shown in FIG. 6, the hole inject layer 201 may be formed into a form of being thin in the middle and thick at the edge. Similarly, the remaining light-emitting functional layers may also have a problem of non-uniform thickness.

In addition, the non-uniform thickness of the light-emitting functional layers may result in non-uniform light emission of the light-emitting functional layers, and further result in non-uniform light emission in pixels (non-uniform light emission mainly at the edges of the pixels), thereby affecting light-emitting performance of an OLED device.

Figure 1:
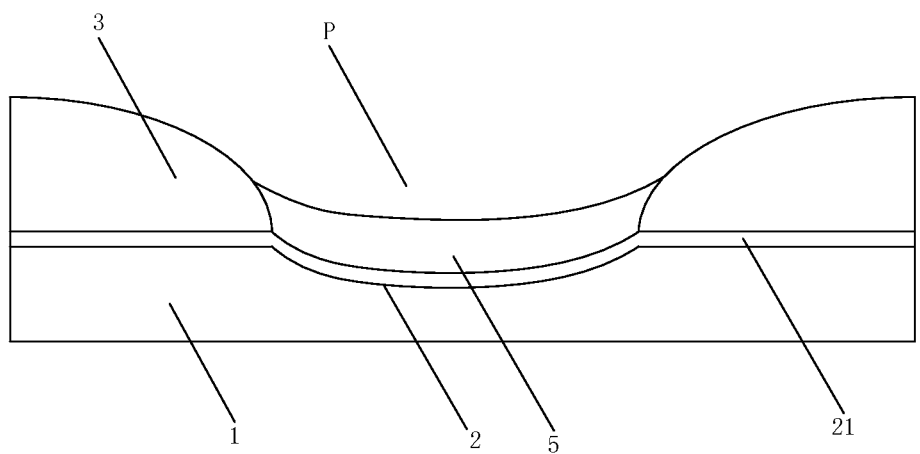
FIG. 1 is a schematic structure diagram of a display substrate provided in an embodiment of the present disclosure.
Figure 2:
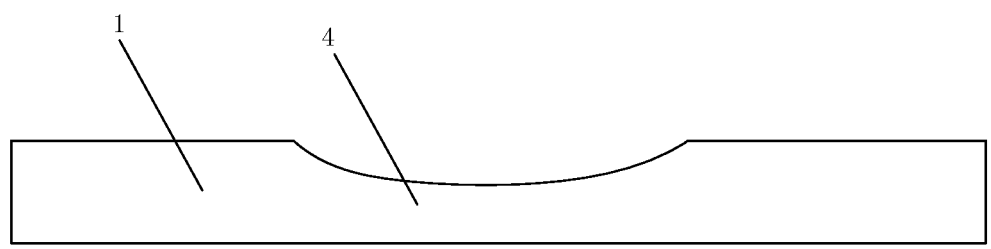
FIG. 2 is a schematic diagram illustrating a recessed structure in FIG. 1.

FIG. 1 is a schematic structure diagram of a display substrate provided in an embodiment of the present disclosure, and FIG. 2 is a schematic diagram illustrating a recessed structure in FIG. 1. As shown in FIGS. 1 and 2, the display substrate includes: a pixel defining layer 3, a recessed structure 4 having a recessed surface 2 and a light-emitting functional layer 5. The pixel defining layer 3 and the light-emitting functional layer 5 are on a side, on which the recessed surface 2 is provided, of the recessed structure 4. The pixel defining layer 3 defines a pixel region P. The recessed surface 2 of the recessed structure 4 is within the pixel region P. The light-emitting functional layer 5 is within the pixel region P, and a surface of the light-emitting functional layer 5 proximal to the recessed structure 4 is at least partially conformal to the recessed surface 2.

According to an embodiment of the present disclosure, the display substrate further includes an insulation layer 1, and a part of the insulation layer 1 in the pixel region P serves as the recessed structure 4.

According to an embodiment of the present disclosure, the insulation layer 1 is made of a resin material. Optionally, the insulation layer 1 is made of an organic photosensitive resin material, and the organic photosensitive resin material may be an acrylic material or a polyimide material mixed with a photosensitive monomer.

According to an embodiment of the present disclosure, the recessed structure 4 has a smaller thickness at an intermediate position than at an edge position. As shown in FIG. 2, the thickness of the recessed structure 4 at the intermediate position is smaller than the thickness of the recessed structure 4 at the edge position at both sides of the intermediate position. Optionally, the recessed surface 2 of the recessed structure 4 is an arc-shaped surface. In this case, a partial recess is formed in the insulation layer 1, the recess is an arc-shaped structure that is recessed downward, and thus, the recessed surface 2 of the recessed structure 4 is an arc-shaped surface. Optionally, in practical applications, the recessed surface 2 of the recessed structure 4 may have other shape, which is not listed one by one here.

Figure 3:
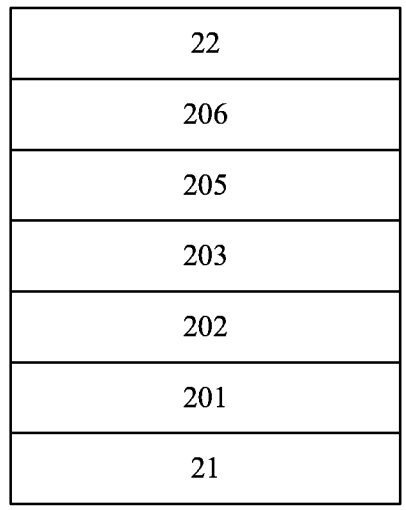
FIG. 3 is a schematic structure diagram of an OLED device in an embodiment of the present disclosure.

According to an embodiment of the present disclosure, the light-emitting functional layer 5 includes a plurality of light-emitting functional sub-layers, a surface, proximal to the recessed structure 4, of at least one light-emitting functional sub-layer proximal to the recessed structure 4 is at least partially conformal to the recessed surface 2. In the embodiment, as shown in FIG. 3, the plurality of light-emitting functional sub-layers include a hole inject layer (HIL, for short) 201, a hole transport layer (HTL, for short) 202, an electroluminescence layer (EL, for short) 203, an electron transport layer (ETL, for short) 204, and an electron inject layer (EIL, for short) 205, which are sequentially disposed in a direction away from the recessed structure 4. In some embodiments, the hole inject layer 201 is close to the recessed structure 4, and a surface, proximal to the recessed structure 4, of the hole inject layer 201 is at least partially conformal to the recessed surface 2. According to an embodiment of the present disclosure, the display substrate may further include a first electrode 21 and a second electrode 22. As shown in FIG. 1, the first electrode 21 is on a side of the pixel defining layer 3 and the light-emitting functional layer 5 proximal to the insulation layer 1, and on a side of the insulation layer 1 proximal to the pixel defining layer 3 and the light-emitting functional layer 5. Optionally, a surface of a part of the first electrode 21 that directly faces the recessed surface 2 of the recessed structure 4 is conformal to the recessed surface 2. Optionally, the first electrode 21 is an anode, and the second electrode 22 is a cathode.

In the embodiment, the first electrode 21, the second electrode 22 and the light-emitting functional layer 5 together form an OLED device. FIG. 3 is a schematic structure diagram of an OLED device in an embodiment of the present disclosure. As shown in FIG. 3, the OLED device includes a first electrode 21, a second electrode 22 and a light-emitting functional layer 5 between the first electrode 21 and the second electrode 22. A hole inject layer 201 is on the first electrode 21, a hole transport layer 202 is on a side of the hole inject layer 201 distal to the first electrode 21, an electroluminescence layer 203 is on a side of the hole transport layer 202 distal to the hole inject layer 201, an electron transport layer 204 is on a side of the electroluminescence layer 203 distal to the hole transport layer 202, an electron inject layer 205 is on a side of the electron transport layer 204 distal to the electroluminescence layer 203, and the second electrode 22 is on a side of the electron inject layer 205 distal to the electron transport layer 204. Referring to FIGS. 1 to 3, the light-emitting functional sub-layers are sequentially arranged between the first electrode 21 and the second electrode 22. Since the hole inject layer 201 is the light-emitting functional sub-layer closest to the first electrode 21, a surface, proximal to the first electrode 21, of the hole inject layer 201 is at least partially conformal to the recessed surface 2. Furthermore, two opposite surfaces of a part of the first electrode 21 directly facing the recessed surface 2 of the recessed structure 4 are conformal to the recessed surface 2. Therefore, in the embodiment, part of the first electrode 21 and part of the hole inject layer 201 are disposed in the recessed structure 4. Optionally, a surface of the hole inject layer 201 proximal to the recessed structure 4 is arc-shaped, and a surface of the hole inject layer 201 distal to the recessed structure 4 is also arc-shaped, so that the hole inject layer 201 has a uniform thickness. Similarly, because the remaining light-emitting functional sub-layers are on the hole inject layer 201, surfaces, proximal to the recessed structure 4 and distal to the recessed structure 4, of each of the remaining light-emitting functional sub-layers may also be arc-shaped, so that the remaining light-emitting functional sub-layers each have a uniform thickness.

In the embodiment, a difference in thickness at positions throughout at least one light-emitting functional sub-layer is in the range of 0 nm to 100 nm, so that the hole inject layer 201 has a uniform thickness. Optionally, at least one light-emitting functional sub-layer has a uniform thickness. In this case, a difference in thickness at positions throughout the light-emitting functional sub-layer is zero, so that the light-emitting functional sub-layer has a more uniform thickness.

In the process of forming the pixel defining layer 3, an acrylic/PI material in the material of the pixel defining layer is deposited downward to form a lower structure of the pixel defining layer, and a fluorine-containing resin material in the material of the pixel defining layer is floated to the surface to form an upper structure of the pixel defining layer. The material of the lower structure of the pixel defining layer is hydrophilic, while the material of the upper structure of the pixel defining layer is hydrophobic. In the embodiment, in the process of forming the light-emitting functional sub-layer (e.g., hole inject layer), the light-emitting functional sub-layer will also climb up along the side of the lower structure of the pixel defining layer under the action of the infiltration. However, since a surface, proximal to the recessed structure, of part of the light-emitting functional sub-layers is at least partially conformal to the recessed surface, a thickness of the light-emitting functional sub-layer at an intermediate position is compensated for, and the light-emitting functional sub-layer is no longer in the form of being thin in the middle and thick at the edge, but an arc-shaped film having substantially uniform thickness, thereby avoiding non-uniform light emission of the light-emitting functional layer caused by non-uniform thicknesses of the light-emitting functional sub-layers.

Further, the display substrate may also include a base substrate and a thin film transistor, and the thin film transistor is between the base substrate and the insulation layer. The thin film transistor is on the base substrate, and the insulation layer 1 is on a side of the thin film transistor distal to the base substrate. The thin film transistor includes a gate electrode, an active layer, a source electrode and a drain electrode. Optionally, the active layer is on the gate electrode, and the source electrode and the drain electrode are on a side of the active layer distal to the gate electrode. A via hole may be provided in the insulation layer 1, and a part of the first electrode 21 is in the via hole to contact with the drain electrode, thereby achieving connection between the first electrode 21 and the drain electrode. It should be noted that the thin film transistor and the via hole are not shown in FIG. 1.

Optionally, the recessed structure 4 is a part of the base substrate in the pixel region P. Specifically, the recessed structure 4 is at a position of the base substrate corresponding to the pixel region.

In the display substrate provided in the embodiment of the present disclosure, a surface, proximal to the recessed structure, of the light-emitting functional layer is at least partially conformal to the recessed surface, so that the light-emitting functional layer has a uniform thickness, thereby avoiding the problem of non-uniform light emission of the light-emitting functional layer and further improving light emitting performance of the OLED device.

Embodiments of the present disclosure provide a display apparatus, which includes a display substrate. The display substrate may be the above-described display substrate according to the embodiments of the present disclosure, and is not repeatedly described here.

In the display apparatus provided in the embodiments of the present disclosure, a surface of the light-emitting functional layer proximal to the recessed structure is at least partially conformal to the recessed surface, so that the light-emitting functional layer has a uniform thickness, thereby avoiding the problem of non-uniform light emission of the light-emitting functional layer and further improving light emitting performance of the OLED device.

Figure 4:
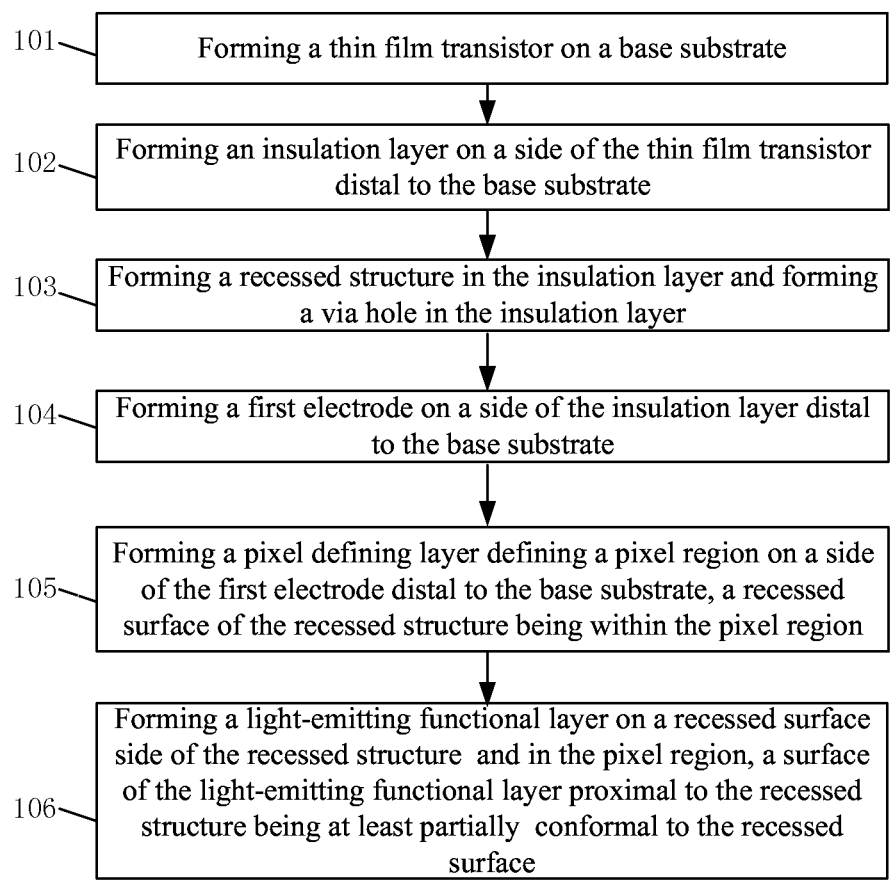
FIG. 4 is a flow chart of a method for fabricating a display substrate provided in an embodiment of the present disclosure.

FIG. 4 is a flow chart of a method for fabricating a display substrate provided in an embodiment of the present disclosure. As shown in FIG. 4, the method includes steps 101 to 106.

Step 101 includes forming a thin film transistor on a base substrate.

Step 102 includes forming an insulation layer on a side of the thin film transistor distal to the base substrate.

Figure 5A:
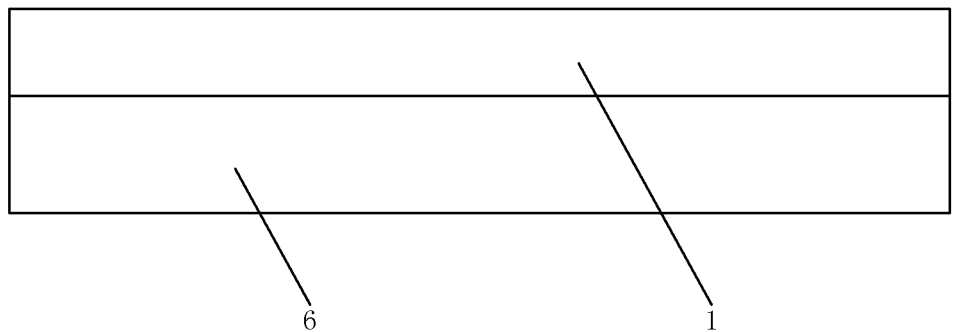
FIG. 5a is a schematic diagram of a step of forming an insulation layer in a method for fabricating a display substrate according to an embodiment of the present disclosure.

FIG. 5a is a schematic diagram of forming an insulation layer. As shown in FIG. 5a, an insulation layer 1 is formed on the base substrate 6. The thin film transistor between the base substrate 6 and the insulation layer 1 is not specifically shown.

Step 103 includes forming a recessed structure in the insulation layer and forming a via hole in the insulation layer.

Step 103 may specifically include steps 1031 and 1032.

Step 1031 includes exposing the insulation layer using a mask to form an unexposed area, a fully exposed area, and a partially exposed area, the partially exposed area includes an exposed portion and an unexposed portion, the mask includes a light-shielding part, a fully light-transmissive part and a partially light-transmissive part. The light-shielding part corresponds to the unexposed area, the fully light-transmissive part corresponds to the fully exposed area, and the partially light-transmissive part corresponds to the partially exposed area. The insulation layer 1 is made of a resin material. Optionally, the insulation layer 1 is made of an organic photosensitive resin material, and the organic photosensitive resin material may be an acrylic material mixed with a photosensitive monomer or a polyimide material mixed with a photosensitive monomer.

Figure 5B:
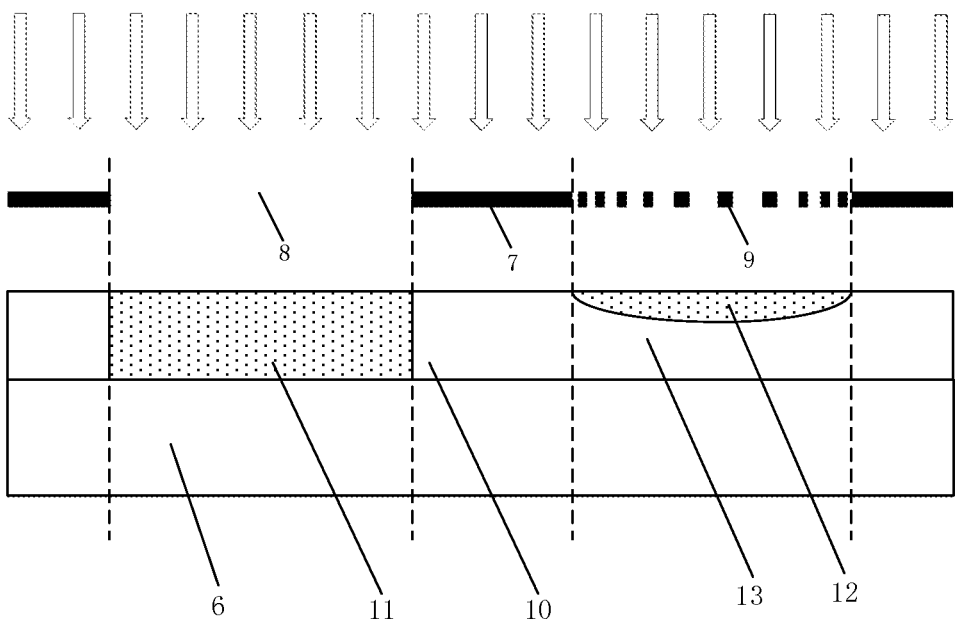
FIG. 5b is a schematic diagram of a step of exposing the insulation layer in the method for fabricating a display substrate according to the embodiment of the present disclosure.

FIG. 5b is a schematic diagram of exposing the insulation layer. As shown in FIG. 5b, the mask includes a light-shielding part 7, a fully light-transmissive part 8 and a partially light-transmissive part 9. The fully light-transmissive part 8 may have an open mask structure, and the partially light-transmissive part 9 may have a half-tone mask structure. After exposing the insulation layer, an unexposed area 10, a fully exposed area 11, and a partially exposed area including an exposed portion 12 and an unexposed portion 13 are formed.

Step 1032 includes developing the exposed insulation layer to remove the fully exposed area to form the via hole, remove the exposed portion in the partially exposed area to form the recessed structure, and keep the unexposed area and the unexposed portion in the partially exposed area. After development, the insulation layer includes the unexposed area and the unexposed portion in the partially exposed area.

Figure 5C:
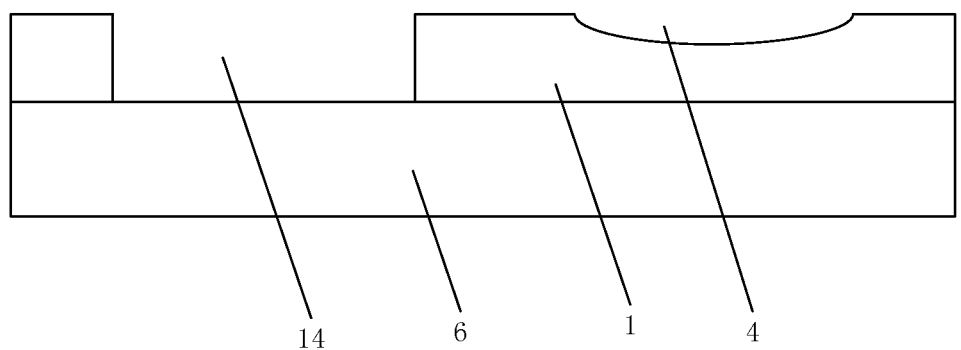
FIG. 5c is a schematic diagram of a step of developing the exposed insulation layer in a method for fabricating a display substrate according to an embodiment of the present disclosure.

FIG. 5c is a schematic diagram of developing the exposed insulation layer. As shown in FIG. 5c, the fully exposed area 11 of the insulation layer in FIG. 5b is removed to form the via hole 14, the exposed portion 12 in the partially exposed area of the insulation layer in FIG. 5b is removed to form the recessed structure 4. After development, the insulation layer 1 includes the unexposed area 10 and the unexposed portion 13 in the partially exposed area in FIG. 5b, which remain.

Step 104 includes forming a first electrode on a side of the insulation layer distal to the base substrate.

As shown in FIG. 1, a first electrode 21 is formed on the insulation layer 1, and a surface of a part of the first electrode 21 that directly faces the recessed surface 2 of the recessed structure 4 is conformal to the recessed surface 2. Furthermore, a part of the first electrode 21 is formed in the via hole 14 in FIG. 5c to be connected to the drain electrode of the thin film transistor.

Step 105 includes forming a pixel defining layer on a side of the first electrode distal to the base substrate, the pixel defining layer defining a pixel region, and the recessed surface of the recessed structure being within the pixel region.

As shown in FIG. 1, a pixel defining layer 3 is formed on a side of the first electrode 21 distal to the insulation layer 1, the pixel defining layer 3 defines a pixel region P, and the pixel region P corresponds to the recessed structure 4. In other words, the recessed structure 4 is a part of the insulation layer 1 corresponding to the pixel region P.

Step 106 includes forming a light-emitting functional layer on a side of the recessed structure where the recessed surface is provided and in the pixel region, and a surface, proximal to the recessed structure, of the light-emitting functional layer is at least partially conformal to the recessed surface. As shown in FIG. 1, a surface of the light-emitting functional layer proximal to the base substrate is in the recessed structure.

As shown in FIG. 1, the light-emitting functional layer may be formed in the pixel region by an ink jet print (IJP, for short) process. For example, the hole inject layer 201 is formed by the IJP process, and a surface of the hole inject layer 201 proximal to the insulation layer is in the recessed structure 4.

In the method for fabricating a display substrate provided in the embodiment, a surface, proximal to the recessed structure, of the light-emitting functional layer is at least partially conformal to the recessed surface, so that the light-emitting functional layer has a uniform thickness, thereby avoiding the problem of non-uniform light emission of the light-emitting functional layer and further improving light emitting performance of the OLED device.

It could be understood that the above embodiments are merely exemplary embodiments adopted for describing the principle of the present disclosure, but the present disclosure is not limited thereto. Various variations and improvements may be made by those of ordinary skill in the art without departing from the spirit and essence of the present disclosure, and these variations and improvements shall also be regarded as falling into the protection scope of the present disclosure.

The invention claimed is:

1. A display substrate, comprising a pixel defining layer, a recessed structure having a recessed surface, and a light-emitting functional layer, wherein the pixel defining layer and the light-emitting functional layer are on a side of the recessed structure where the recessed surface is provided; the pixel defining layer defines a pixel region; the recessed surface of the recessed structure is in the pixel region; the light-emitting functional layer is in the pixel region, and a surface of the light-emitting functional layer proximal to the recessed structure is at least partially conformal to the recessed surface, wherein the light-emitting functional layer comprises a plurality of light-emitting functional sub-layers, a surface, proximal to the recessed structure, of at least one light-emitting functional sub-layer proximal to the recessed structure is at least partially conformal to the recessed surface, and a difference in thickness throughout at least one of the plurality of light-emitting functional sub-layers is in the range of 0 nm to 100 nm, wherein the pixel defining layer comprises a lower portion and an upper portion, the lower portion is closer to the recessed structure than the upper portion the lower portion is hydrophilic and the upper portion is hydrophobic, and a thickness of a part of the recessed structure in the pixel region gradually decreases from an edge of the pixel region to a center of the pixel region.

2. The display substrate of claim 1, further comprising an insulation layer, wherein a part of the insulation layer in the pixel region serves as the recessed structure.

3. The display substrate of claim 1, wherein a thickness of the recessed structure at an intermediate position is smaller than a thickness of the recessed structure at an edge position.

4. The display substrate of claim 1, wherein the recessed surface of the recessed structure is an arc-shaped surface.

5. The display substrate of claim 2, further comprising a first electrode, wherein the first electrode is on a side of the pixel defining layer and the light-emitting functional layer proximal to the insulation layer and on a side of the insulation layer proximal to the pixel defining layer and the light-emitting functional layer.

6. The display substrate of claim 5, wherein a surface of a part of the first electrode that directly faces the recessed surface of the recessed structure is conformal to the recessed surface.

7. The display substrate of claim 1, wherein the plurality of light-emitting functional sub-layers comprise a hole inject layer, a hole transport layer, an electroluminescence layer, an electron transport layer, and an electron inject layer, which are sequentially disposed in a direction away from the recessed structure, and a surface of the hole inject layer proximal to the recessed structure is at least partially conformal to the recessed surface.

8. The display substrate of claim 7, wherein the surface of the hole inject layer proximal to the recessed structure is arc-shaped, and a surface of the hole inject layer distal to the recessed structure is also arc-shaped.

9. The display substrate of claim 1, wherein at least one of the plurality of light-emitting functional sub-layers has a uniform thickness.

10. The display substrate of claim 1, wherein the recessed structure is made of a resin material.

11. The display substrate of claim 10, wherein the recessed structure is made of an organic photosensitive resin material.

12. The display substrate of claim 11, wherein the organic photosensitive resin material is an acrylic material mixed with a photosensitive monomer or a polyimide material mixed with a photosensitive monomer.

13. The display substrate of claim 1, further comprising a base substrate, wherein a part of the base substrate in the pixel region serves as the recessed structure.

14. A display apparatus, comprising the display substrate of claim 1.

15. A method for fabricating a display substrate, comprising:
   forming a recessed structure having a recessed surface;
   forming a pixel defining layer on a side of the recessed structure where the recessed surface is provided, the pixel defining layer defining a pixel region, and the recessed surface of the recessed structure being within the pixel region; and
   forming a light-emitting functional layer on the side of the recessed structure where the recessed surface is provided, the light-emitting functional layer being within the pixel region, and a surface of the light-emitting functional layer proximal to the recessed structure being at least partially conformal to the recessed surface;
   wherein the light-emitting functional layer comprises a plurality of light-emitting functional sub-layers, a surface, proximal to the recessed structure, of at least one light-emitting functional sub-layer proximal to the recessed structure is at least partially conformal to the recessed surface, and a difference in thickness throughout at least one of the plurality of light-emitting functional sub-layers is in the range of 0 nm to 100 nm,
   wherein the pixel defining layer comprises a lower portion and an upper portion, the lower portion is a closer to the recessed structure than the upper portion, the lower portion is hydrophilic and the upper portion is hydrophobic, and
   a thickness of a part of the recessed structure in the pixel region gradually decreases from an edge of the pixel region to a center of the pixel region.

16. The method of claim 15, wherein forming the recessed structure comprises:
   forming an insulation layer; and
   forming a part of the insulation layer in the pixel region into the recessed structure.

17. The method of claim 16, wherein forming a part of the insulation layer in the pixel region into the recessed structure comprises:
   exposing the insulation layer using a mask to form an unexposed area, a fully exposed area, and a partially exposed area, the partially exposed area comprising an exposed portion and an unexposed portion; and
   developing the exposed insulation layer to remove the fully exposed area to form a via hole, remove the exposed portion in the partially exposed area to form the recessed structure, and keep the unexposed area and the unexposed portion in the partially exposed area.

18. The method of claim 15, wherein the light-emitting functional layer is formed in the pixel region by an ink jet print process.

* * * * *